United States Patent [19]

Jebens et al.

[11] Patent Number: 4,688,328
[45] Date of Patent: Aug. 25, 1987

[54] METHOD FOR FABRICATING A PRINTED CIRCUIT BOARD ASSEMBLY AND METHOD FOR THE MANUFACTURE THEREOF

[75] Inventors: Robert W. Jebens, Skillman, N.J.; Gerard Samuels, Paoli, Pa.

[73] Assignee: RCA Corporation, Princeton, N.J.

[21] Appl. No.: 939,143

[22] Filed: Dec. 8, 1986

Related U.S. Application Data

[62] Division of Ser. No. 811,824, Dec. 20, 1985.

[51] Int. Cl.$^4$ ............................................. H05K 3/34
[52] U.S. Cl. ...................................... 29/839; 29/848; 439/83
[58] Field of Search .................... 29/838, 839, 848; 339/17 C, 17 B, 17 E

[56] References Cited

U.S. PATENT DOCUMENTS

| | | | |
|---|---|---|---|
| 2,255,184 | 9/1941 | Osenberg | 18/59 |
| 2,979,554 | 4/1961 | Maitland . | |
| 3,142,783 | 7/1964 | Warren . | |
| 3,143,787 | 8/1964 | Babbe . | |
| 3,154,281 | 10/1964 | Frank | 248/201 |
| 3,428,934 | 2/1969 | Reider, Jr. et al. | 339/17 |
| 3,514,737 | 5/1970 | Renshaw, Jr. | 339/17 |
| 3,523,268 | 8/1970 | Foster | 339/17 |
| 3,543,215 | 11/1970 | Jones . | |
| 3,900,239 | 8/1975 | Anhalt et al. | 339/17 CF |
| 3,947,984 | 4/1976 | Winrow | 40/28 R |
| 3,971,610 | 7/1976 | Buchoff et al. | 339/17 R |
| 4,050,756 | 9/1977 | Moore | 339/59 M |
| 4,075,395 | 2/1978 | Ohnishi | 428/542 |
| 4,158,450 | 6/1979 | Suzuki | 248/1 |
| 4,202,091 | 5/1980 | Ohnishi | 29/527.1 |
| 4,211,890 | 7/1980 | Sado et al. | 174/68.5 |
| 4,219,756 | 8/1980 | Nishida et al. | 310/348 |
| 4,254,448 | 3/1981 | Martyniak | 361/409 |
| 4,353,609 | 10/1982 | Haas | 339/17 C |
| 4,361,862 | 11/1982 | Martyniak | 361/404 |
| 4,435,031 | 3/1984 | Black et al. | 339/17 C |
| 4,516,816 | 5/1985 | Winthrop . | |
| 4,573,105 | 2/1986 | Beldavs | 361/403 |

OTHER PUBLICATIONS

"New Technique Combines Metals and Plastics", *Plastics Design Forum*, Mar./Apr. 1976, pp. 19-23.
ICI Victrex-Pes for Moulded Circuit Boards.

*Primary Examiner*—P. W. Echols
*Assistant Examiner*—Carl J. Arbes
*Attorney, Agent, or Firm*—Joseph S. Tripoli; Kenneth R. Glick

[57] ABSTRACT

A printed circuit board assembly is disclosed which includes a printed circuit board having in situ molded members for mechanically securing electrical and mechanical components and the like to the printed circuit board. The printed circuit board is manufactured using a method wherein a printed circuit board is initially prepared with the required printed circuit patterns and with apertures for in situ molded members and for the leads of the electrical components. The required molded members are then molded in situ in specified apertures of the printed circuit board. The electrical components are thereafter mechanically secured in place with the in situ molded members and the leads of the components are connected to the contact pads of the printed circuit pattern.

6 Claims, 10 Drawing Figures

METHOD FOR FABRICATING A PRINTED CIRCUIT BOARD ASSEMBLY AND METHOD FOR THE MANUFACTURE THEREOF

This is a division of application Ser. No. 811,824, filed Dec. 20, 1985.

This invention relates to a novel printed circuit board assembly having electrical components mechanically fastened and electrically connected to a printed circuit board and to the method fr the manufacture of the printed circuit board assembly.

BACKGROUND OF THE INVENTION

Printed circuit board assemblies are widely used in the manufacture of electrical devices, such as television receivers, video cassette recorders, computers and the like. The printed circuit board assemblies typically include a printed circuit board having a conductive printed circuit pattern formed on at least one of the surfaces of the board and various different types of electrical components which are mounted on the printed circuit board and electrically connected to the printed circuit pattern.

In the conventional method of manufacturing printed circuit board assemblies, the electrical components are initially positioned at precise locations on the printed circuit board so that the electrical leads of the electrical components are aligned with the appropriate contact pads of the printed circuit pattern. The electrical components are then mechanically secured in position. The electrical leads are then soldered to the contact pads of the printed circuit pattern.

The electrical components which are commonly employed in the manufacture of printed circuit board assemblies vary widely in size, weight, shape and function and require a variety of different mechanical fastening methods to secure the electrical components to the printed circuit board. Relatively small, lightweight leaded electronic components, such as axial leaded resistors and capacitors, can be secured to the printed circuit board by simply inserting the leads of the components through apertures formed in the printed circuit board and then bending the leads to mechanically lock the components in place. Other types of electronic components which generally are considerably larger and/or heavier in weight, such as transformers, motors, tuners and the like, must be more firmly secured to the printed circuit board. Still other types of components, such as speakers, certain types of heat sinks, daughter boards and the like, are required to be mounted so as to stand off from the surface of the printed circuit board. For both of the latter types of electrical components, it has become conventional practice to use mechanical supports which are secured to the printed circuit board to hold the electrical components in position.

In addition to the electrical components, printed circuit board assemblies also often include various types of mechanical devices, such as spacers, mounting brackets, reinforcement ribs and the like, which must likewise be secured to the printed circuit board at precise locations.

Because of the wide variation in the requirements for the mounting of different types of electrical components and different types of mechanical devices, a considerable number of different shaped parts are required to be secured in precisely determined locations on many types of printed circuit board assemblies.

In the conventional prior art method heretofore used in the manufacture of printed circuit board assemblies, the mechanical supports for the electrical components, mechanical devices and the like were initially formed from a molded plastic material or a metal stamping. After the required number and types of parts were prepared, the parts were secured in position on a printed circuit board. One method which was widely employed to secure the parts to the printed circuit board was to use metal fasteners, such as screws, to hold the parts in position. Another method which was also used was to mold the parts with spring-loaded leads, allowing the parts to be snap-fitted into preformed apertures in the printed circuit boards. The above-described methods had a number of distinct disadvantages. The parts required for the printed circuit board assemblies were made in a separate operation which inherently increases the expense and the lead time required for the manufacture of printed circuit board assemblies. Furthermore, because of the wide variety of different sizes, shapes and types of parts required for even a relatively simple printed circuit board assembly, a relatively large inventory of different types of parts had to be maintained which also significantly increases the overall manufacturing costs. A further related problem with the prior art methods was that a shortage of even one critical part could cause a disruption of the production of the entire printed circuit board assembly. A still further problem encountered when using metal fasteners to hold the parts in place was that metal fasteners would often become loosened from the parts on the printed circuit boards resulting in electrical shorts. The snap-in parts likewise were not satisfactory in that preformed apertures in the board had to be accurately formed in order for the part to be properly insertable and held in position on the printed circuit board. If the holes were slightly undersized, it was often difficult or impossible to insert the parts into the board. If the holes were slightly oversized, the parts would be loosely held and could even fall out of the board.

A still further problem encountered with the prior art methods was that numerous errors were made with regard to the specific types and the orientation of the parts in the printed circuit board. This was caused in some cases by human error during hand insertion of the numerous different types of parts into the printed circuit board. Even using automatic insertion equipment, defects in placement were often caused by malfunctions of the automatic insertion equipment due to variations in the exact shape of the parts being inserted. This problem was further complicated by the numerous and different types of parts required to be inserted at different specific locations in a typical printed circuit board.

It has also recently been suggested to mold a plastic board having the required supports and the like molded as part of the board and then thereafter apply the required circuitry to the board. This suggestion has not, however, proven to be satisfactory. The resulting three-dimensional boards are inherently expensive to manufacture and limited in size. It is, furthermore, extremely difficult to form the required electrical circuitry on the molded board with the supports and the like extending outwardly from the surface of the board.

The problems encountered with the prior art methods for making printed circuit board assemblies, as noted above, have become especially critical as a result of the increased need to automate as much as possible of the manufacture of printed circuit board assemblies. In order to realize the full benefits of automation, it is necessary that there be consistency from part to part employed in the automated assembly process to insure accurate placement with automated equipment. This is particularly true with regard to the printed circuit boards and the parts secured to the surface of the printed circuit boards as the automatic insertion of the electronic components associated with the parts on the printed circuit board requires that the proper type of parts be precisely located with the correct orientation to receive the electrical components.

It would be highly desirable if an efficient method could be provided for consistently manufacturing printed circuit board assemblies having the parts required for mounting electrical components and mechanical devices precisely located on the printed circuit board.

SUMMARY OF THE INVENTION

A printed circuit board assembly is disclosed which includes a printed circuit board having in situ molded members for mechanically securing electrical and mechanical components and the like to the printed circuit board. The printed circuit board is manufactured using a method wherein a printed circuit board is initially prepared with the required printed circuit patterns and with apertures for in situ molded members and for the leads of the electrical components. The required molded members are then molded in situ in specified apertures of the printed circuit board. The electrical and mechanical components are thereafter mechanically secured in place with the in situ molded members and the leads of the electrical components are connected to the contact pads of the printed circuit pattern.

DETAILED DESCRIPTION OF THE DRAWING

DETAILED DESCRIPTION OF THE INVENTION

Figure 1:
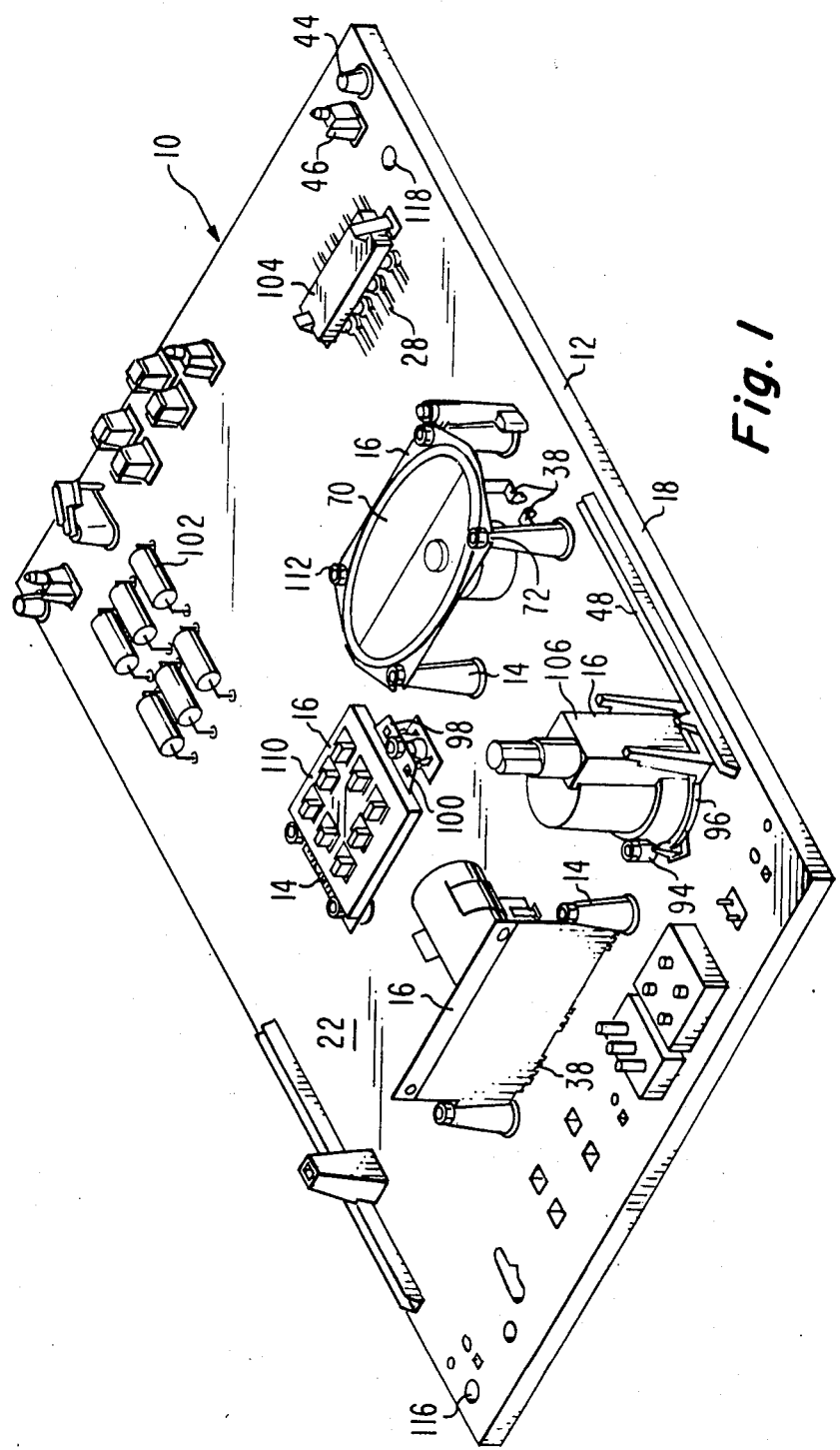
FIG. 1 is an isometric illustration of a typical printed circuit board assembly of this invention.

The printed circuit board assembly 10 of this invention is comprised of a printed circuit board 12, in situ molded members 14 and electrical components 16.

The printed circuit board 12 is relatively conventional in composition and configuration. The printed circuit board 12 has an electrical insulative substrate 18 with opposing first and second surfaces 20, 22. The substrate 18 can be made from various well known materials commonly employed for this application, such as paper reinforced phenolic laminates, glass fabric reinforcecd epoxy laminates and the like. The selection of the particular materials used for the substrate 18 is determined by the processing conditions the substrate 18 will be subjected to in manufacture, such as wave soldering, and the requirements for the ultimate application, such as temperature and weather resistance.

Figure 4:
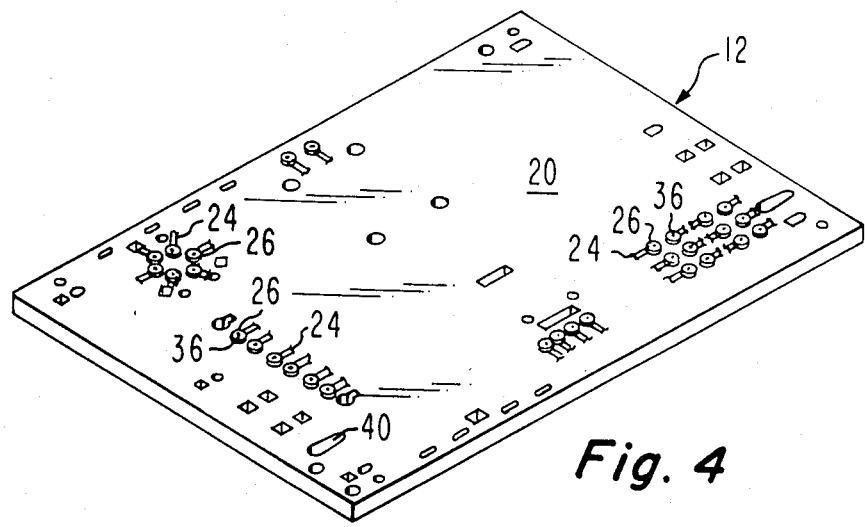
FIG. 4 is an isometric illustration of the printed circuit board assembly of FIG. 1 which further has illustrative printed circuit patterns defined thereon.

The substrate 18 has a conductive printed circuit pattern 24 (not shown in FIG. 1 but shown in FIG. 4) which includes contact pads 26 formed on at least the first surface 20, commonly called the back surface of the printed circuit board 12 and may also have additional conductive circuit patterns 28 formed on the second surface 22, commonly called the face surface of the printed circuit board 12.

Figure 2:
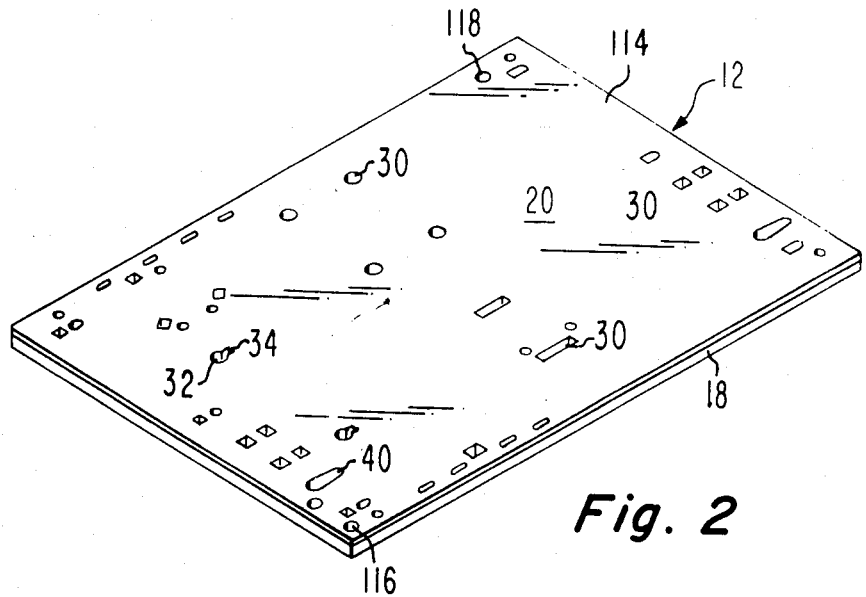
FIG. 2 is an isometric illustration of a partially manufactured printed circuit board of the type used in the manufacture of the printed circuit board assembly of FIG. 1, shown in an inverted position and which has a layer of conductive material on its surface with apertures in situ molded members formed through the printed circuit board.

As best seen in FIG. 2, a number of first type apertures 30 are formed through the substrate 18 from the first surface 20 to the second surface 22. The in situ molded members 14 are formed within certain of the first type apertures 30, as will be explained in greater detail below. Referring to FIG. 2, it can be seen that the first type apertures 30 are formed with various shaped perimeters in order to accommodate the different shapes and sizes of the in situ molded members 14 to be formed in the apertures 30. To maintain the orientation of the in situ molded members 14 in the printed circuit board 12, the first type apertures 30 are preferably of a shape which prevents rotation of the in situ molded members 14 in the apertures 30. Apertures 30 which are square or rectangular are especially suitable for this purpose. Round apertures 32 can likewise be used and, in general, the molding process will result in the in situ molded members 14 having a sufficiently tight fit to the perimeter of the apertures 32 to prevent rotation. However, as additional protection, it is preferable to provide round apertures 32 with keyhole extensions 34 to positively prevent rotation.

In addition to the first type apertures 30, second type apertures 36 are formed in the printed circuit board 12. These apertures 36 are for passage of the electrical leads 38 of the electrical components 16 mounted on the second surface 22 to the contact pads 26 of the printed circuit pattern 24 on the first surface 20 of the printed circuit board 12.

The first type apertures 30 for receiving the in situ molded members 14 and the second type apertures 36 for the electrical leads 38 are located relative to each other so that when an electrical component 16 is mechanically secured to the printed circuit board 12 with in situ molded members 14, the electrical leads 38 of the electrical components 16 will extend through the appropriate second type apertures 36 in the printed circuit board 12.

In addition to the first type apertures 30 used for the in situ molded members 14 and the second type apertures 36 used as passages for the electrical leads 38, additional apertures 40 of the first type are usually provided in the printed circuit board 12 for in situ molded mechanical devices 42, such as spacers 44, locks 46, reinforcement ribs 48 and the like.

Figure 5:
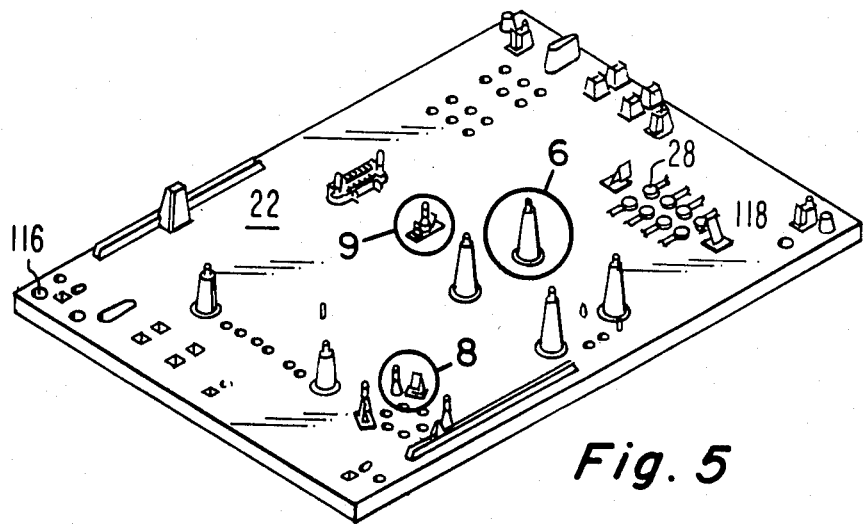
FIG. 5 is an isometric illustration of the printed circuit board assembly of FIG. 4 shown in inverted position and having in situ molded members formed in certain of the apertures of the printed circuit board.

As indicated above, the printed circuit board assembly 10 of this invention includes in situ molded members 14 which are used to secure the electrical components 16, mechanical supports and the like. As can be best seen in FIG. 5 taken in combination with FIGS. 6 and 7, the in situ molded members 14 are molded in place within the first type apertures 30 formed in the printed circuit board 12. The in situ molded members 14 are preferably formed by injection molding in preselected apertures in the printed circuit board 12. In order to obtain the maximum benefits of this invention with regard to the accurate placement of the in situ molded members 14 and to reduce the final production cost, all of the in situ molded members 14 are preferably simultaneously molded in the printed circuit board 12 using a pair of matching molds having the required molding features defined in their respective molding surfaces. The accurate placement of each of the in situ molded members 14 to each other is inherently obtained from printed circuit board to printed circuit board because of the simultaneous molding. Furthermore, there is no need for a separate molding step for each part, inventorying of the different parts and individual insertion as required in the prior art processes. In addition, with conventional molding procedures, there is a perfect fit of the in situ molded member 14 within its respective aperture 30.

The materials employed to mold the in situ molded members 14 can be selected from a wide range of materials depending upon the molding condition to be employed and the physical properties required in the final in situ molded member 14. The materials used for molding should be preferably relatively easy to injection mold with relatively good flow properties to form certain of the more intricately shaped parts. Of primary importance, however, is the final mechanical properties of the in situ molded members 14. The physical strength of the in situ molded members 14 is important in order to hold relatively heavy electrical components 16. Resiliency is also required for in situ molded members 14 which will be used as spring clips and the like. A very important property is temperture resistance of the plastic employed, particularly if the printed circuit board 12 will be subjected to mass soldering, such as wave soldering, where contact temperatures of 200° to 285° C. for up to 20 seconds is not uncommon. There are a number of commercially avaialable plastics which have suitable high temperature performance for use in these types of applications. These materials include, for example, polyarylsulfones, which are available from Union Carbide Corporation under the trademark UDEL ®; polyethersulfone and polyetheretherketone, which are available from ICI America Corporation under the trademark of VICTREX ®; polyethermide, which is available from General Electric Corporation under the trademark ULTEM ®; polyethyleneterephthalate, which is available from E. I. Dupont DeNemours and Company under the trademark RYNITE ®; and various compositions of these materials with high temperature reinforcement materials, such as high glass transition temperature glass fiber.

The in situ molded members 14 can be molded in various configurations depending upon the intended end use of the particular in situ molded members 14. However, all of the in situ molded members 14 should be formed as an integral part having a base portion 50 firmly secured to the printed circuit board 12 and a second portion 52 extending outwardly from the second surface 22 of the printed circuit board 12.

The base portion 50 is molded so as to conform to and be in locking engagement with the perimeter of the aperture 30 in which it is formed. More preferably, the base portion 50 should be molded with a flange portion 53 extending along the first surface 20 of the printed circuit board 12 so as to prevent removal of the in situ molded members 14 from the apertures 30. To further assure inadvertent removal or reorientation of the in situ molded members 14, an opposing flange portion 54 should be provided which extends over the second surface 22 of the printed circuit board 12.

Figures 6, 7, 8, 9, 10:
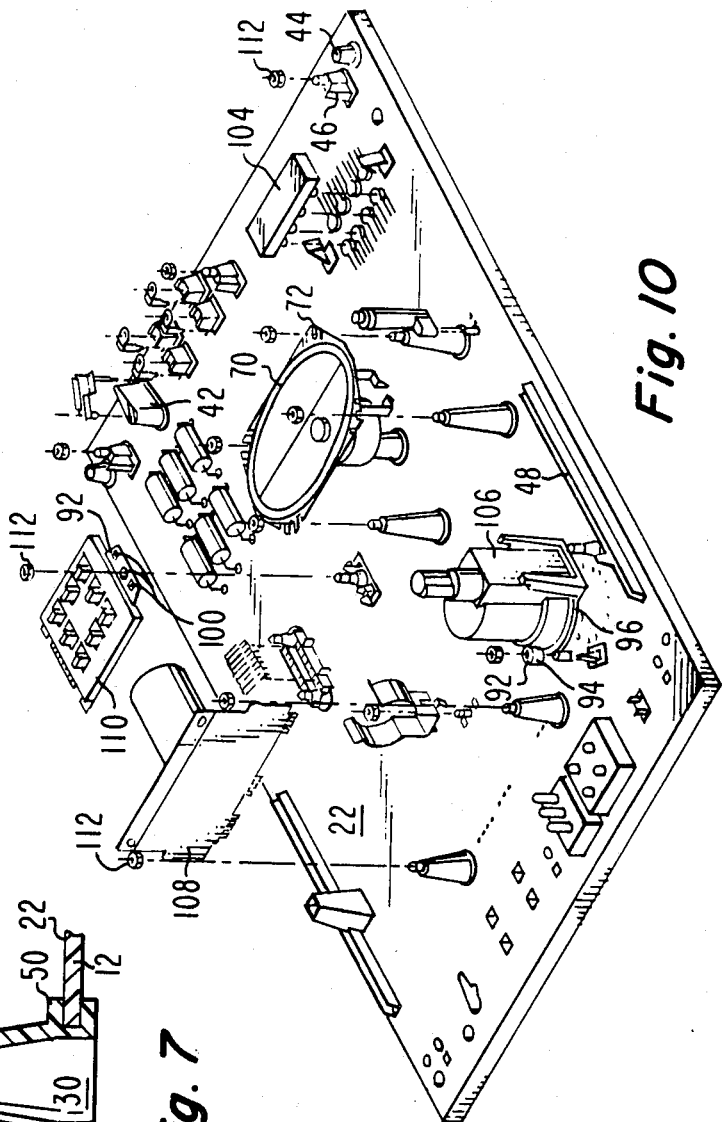
FIG. 6 is an enlarged view of an in situ molded member taken as indicated by the line circle and number 6 on FIG. 5.
FIG. 7 is a cross-sectional view through the in situ molded member and printed circuit board taken as indicated by the line and arrow 7—7 on FIG. 6.
FIG. 8 is an enlarged view of a further type of in situ molded member taken as indicated by the circle and number 8 on FIG. 5.
FIG. 9 is a further enlarged illustration of a further type of in situ molded member taken as indicated by the circle and number 9 on FIG. 5.
FIG. 10 is an exploded view showing the population of the electrical components and mechanical devices on the printed circuit board.

As best shown in FIG. 7, it is preferable to mold the in situ molded members 14 with a hollow interior 56 and with relatively uniform thin walls 58 so as to reduce material cost and, more importantly, to facilitate solidification of the molded part without distortion of the in situ molded member 14.

The configuration of the in situ molded members 14 integral projecting portions 52 have a predetermined configuration depending on its intended function in the printed circuit board assembly 10. In FIG. 6, there is shown a conically shaped in situ molded member 62 having a land area 64 and a projecting guide portion 66 which includes a detent 68. The conical type of in situ molded member 62 can advantageously be used as a standoff for a speaker 70 or the like in that the slots 72 on the speaker mounts are held by the combination of the land area 64 and the detent 68 in the guide portion 66.

An additional type of in situ molded member 74 is shown in FIG. 8 which includes a guide pin 76 and a locking clip 78. This member 74 is molded into the printed circuit board 12 with the locking flanges 80 similar to that shown in FIG. 7. The guide pin 76 and locking clip 78 of this type of in situ molded member 74 can be used in combination with other similar members to hold a relatively large electrical component 16 in position on the second surface 22 prior to soldering, as shown in FIG. 1.

Other types of in situ molded members 14 can likewise be used, such as members 82 having central guide pins 84 with a pair of adjacent clips 86, 88, as shown in FIG. 9.

The printed circuit board assembly 10 also includes electrical components 16 and possible mechanical devices 42. The electrical components 16 include cooperative means 92 for engaging the in situ molded members 14, such as ring guides 94, edge lips 96 and mounting brackets 98 with mating holes 100. As shown in FIG. 10, the electrical components 16 and mechanical devices 42 are aligned with the respective in situ molded members for guiding into place, with the electrical components 16 being mechanically secured in position by the in situ molded members 14 and the electrical leads 38 extending through the second type apertures 36. The electrical components 16 of the printed circuit board assembly 10 can be quite varied and, as shown, can include leaded resistors and capacitors 102, surface mount components 104, speakers 70, transformers 106, daughter boards 108, channel selector 110 and the like.

To complete the assembly 10, the electrical leads 38 are connected, typically by soldering, to the respective contact pads 26 of the printed circuit pattern 24. If desired, additional fasteners, such as speed nuts 112 or the like, can be secured to the in situ molded members 14 to further insure that the electrical components 16 will be held in position.

The method employed to manufacture the printed circuit board assemblies 10 of this invention is comprised of the steps of forming a printed circuit board 12 with the required apertures 30, 36, 40 and printed circuit pattern 24; forming the in situ molded members 14 in preselected apertures 30, 40; populating the printed circuit board 12 with electrical components 16 and mechanical devices 42; and electrically connecting the leads 38 of the electrical components 16 to contact pads 26 on the printed circuit pattern 24.

The printed circuit board 12 can be manufactured using various conventional methods well known to those skilled in the art. The manufacturing steps in a particular method can likewise be varied in order and still obtain satisfactory printed circuit boards 12.

The method which has, however, been found most preferable is to start with printed circuit board blanks having an insulative substrate 18 and a layer of a conductive material 114, such as copper, on one or both of the surfaces 20, 22. Suitable printed circuit board blanks of this type are commercially available from many different sources. The first type apertures 30, which can vary considerably in size and shape and which are used for the in situ molded members 14, are punched or otherwise formed in the printed circuit board blank, as shown in FIG. 2. Thereafter, the second type apertures 36 are punched, drilled or otherwise formed thrugh the printed circuit board 12. The first type apertures 30 are positioned relative to the second type apertures 36 so that the electrical components 16 held by the in situ molding members will have the electrical leads 38 aligned through the second type apertures 36. It should be appreciated, however, that the order of forming the apertures 30, 36, 40 can be reversed and alternatively, all the apertures 30, 36, 40 can be formed at the same time.

After the apertures 30, 36, 40 are formed in the printed circuit board 12, the conductive layer 114 is treated so as to form conductive printed circuit patterns 24 on the surface of the printed circuit board 12. This is conventionally done by applying a photoresist to the surface of the conductive layer 114, selectively exposing the photoresist, developing the photoresist and then etching away the unwanted portions of the conductive layer 114 to provide the printed circuit patterns 24. The resulting printed circuit board 12 is formed with contact pads 26 having an aperture 36 for the electrical lead 38 within the contact pads 26. The above-described process for forming the printed circuit patterns 24 is a substractive process in that conductive material is removed to form the printed circuit patterns 24. It is also possible to use additive methods wherein the printed circuit pattern 24 is deposited on the surface of a nonconductive board by electrodeposition or other similar processes.

Figure 3:
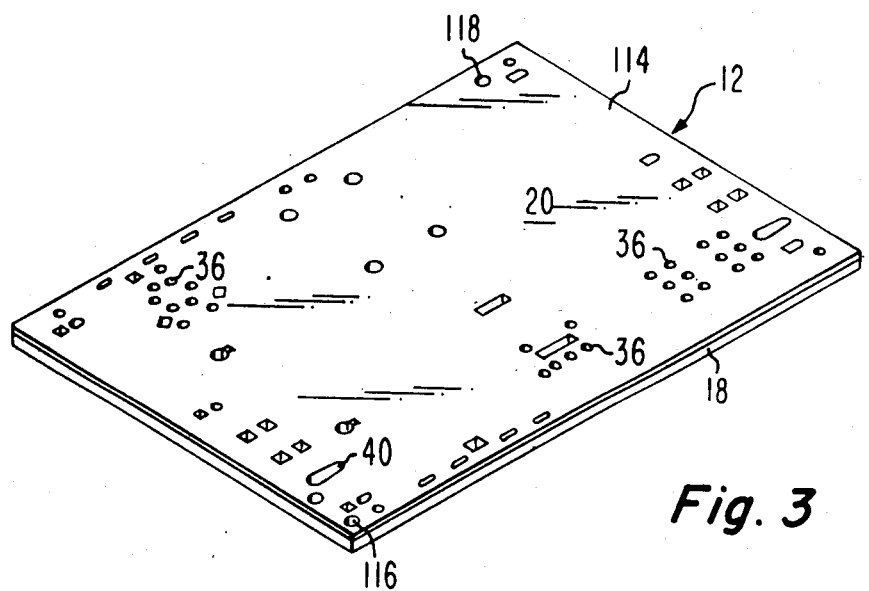
FIG. 3 is an isometric illustration of the printed circuit board of FIG. 2 which further includes apertures for electrical leads.

After the printed circuit board 12 shown in FIG. 3 is prepared, the in situ molded members 14 are formed in selected apertures 30, 40. The preferred method of forming the in situ molded members 14 is by injection molding. In this method, the printed circuit board 12 is inserted in a mold (not shown) having matched molding plates with cavities mirroring the shape of the molded members 14 to be molded in the apertures 30, 40 of the printed circuit board 12. The printed circuit board 12 is aligned in the mold with the guide holes 116, 118 which are deliberately somewhat offset to assure that the printed circuit board 12 is properly aligned with the correct side up. The mold is clamped with sufficient pressure to prevent flash from forming about the base portion 50 of the in situ method members 14, because excess flash could cover over adjacent contact pads 26 and thereby prevent soldering of the leads 38 to the contact pads 26.

The plastic used for the in situ molded members 14 is then injected into the mold to form the in situ molded members 14 using conventional well known molding methods.

After the plastic has solidified, the printed circuit board 12, with the in situ molded members 14 molded in the printed circuit board 12, is removed from the molding press. The printed circuit board 12 is then populated with the electronic components 16. This can readily be performed with exceptionally good results with robotic equipment because all of the in situ molded members 14, having been molded simultaneously, are precisely located with respect to each other on the printed circuit board 12. Problems of missing parts, misplaced parts and misoriented parts commonly encountered in the prior art are eliminated by the present method.

After all the components 16 are in position additional fasteners can be employed if desired. The electrical leads 38 of the mounted electrical components 16 are then soldered to the contact pads 26 to complete the assembly process.

What is claimed is:

1. The method for the manufacture of a printed circuit board assembly, comprising the steps of:
    (a) forming a printed circuit board having (1) an insulative substrate with opposing first and second surfaces; (2) a conductive printed circuit pattern including a contact pad formed on at least the first surface of the substrate; (3) a first aperture having a predetermined shaped perimeter extending through the substrate at a predetermined position relative to said contact pad of the printed circuit pattern; and (4) a second aperture extending from the first surface to the second surface of the substrate, said first aperture being in registration with the contact pad; and
    (b) molding a first in situ molded member in said first aperture, said first in situ molded member having (1) a base portion formed in locking engagement with the substrate immediately about the perimeter of the first aperture; and (2) an integral projecting portion of a predetermined configuration integral with the base portion and extending outwardly from the second surface of the substrate.

2. The method according to claim 1 which further includes the steps of:
    (a) providing an electrical component having (1) cooperative means for mechanically engaging the in situ molded member; and (2) an electrical lead positioned to extend through the second aperture to the contact pad when the cooperative means of the electrical component is aligned with and in mechanical engagement with the in situ molded member;
    (b) mechanically securing electrical components to the second surface of the printed circuit board by engaging the cooperative means with the first in situ molded member;

(c) inserting the lead of said electrical component through the second aperture; and (d) electrically connecting the lead to said contact pad.

3. The method according to claim 1 wherein the lead is electrically connected to the contact pad by soldering the lead to the contact pad.

4. The method according to claim 1 wherein a third aperture is formed in said printed circuit board and a second in situ molded member is molded in said third aperture.

5. The method according to claim 4 wherein the first and second in situ method members are molded in a predetermined fixed spaced relationship to each other.

6. The method according to claim 4 wherein said first and second in situ molded members are simultaneously molded in their respective apertures.

* * * * *